United States Patent
Byrn (10) Patent No.: US 8,415,714 B2
(45) Date of Patent: Apr. 9, 2013

(54) PROGRAMMABLE NANOTUBE INTERCONNECT

(75) Inventor: Jonathan Byrn, Kasson, MN (US)

(73) Assignee: LSI Corporation, Milpitas, CA (US)

( * ) Notice: Subject to any disclaimer, the term of this patent is extended or adjusted under 35 U.S.C. 154(b) by 270 days.

(21) Appl. No.: 12/354,768

(22) Filed: Jan. 15, 2009

(65) Prior Publication Data

US 2009/0189196 A1      Jul. 30, 2009

Related U.S. Application Data

(62) Division of application No. 11/286,546, filed on Nov. 23, 2005, now Pat. No. 7,494,842.

(51) Int. Cl.
*H01L 23/52*       (2006.01)
*H01L 21/283*      (2006.01)

(52) U.S. Cl. ............... 257/209; 438/129; 257/E23.141; 257/E21.159

(58) Field of Classification Search .............. 257/209, 257/E23.141, E21.159; 438/128
See application file for complete search history.

(56) References Cited

U.S. PATENT DOCUMENTS

| | | | | |
|---|---|---|---|---|
| 5,504,354 A * | 4/1996 | Mohsen | ......................... | 257/209 |
| 6,933,222 B2 * | 8/2005 | Dubin et al. | .................. | 438/614 |
| 7,084,507 B2 * | 8/2006 | Awano | .......................... | 257/773 |
| 7,781,862 B2 * | 8/2010 | Bertin et al. | .................. | 257/529 |

\* cited by examiner

*Primary Examiner* — Calvin Lee
*Assistant Examiner* — Monica D Harrison
(74) *Attorney, Agent, or Firm* — Raj Abhyanker, P.C.

(57) ABSTRACT

Programmable nanotube interconnect is disclosed. In one embodiment, a method includes forming a interconnect layer using a plurality of nanotube structures, and automatically altering a route of an integrated circuit based on an electrical current applied to at least one of the plurality of nanotube structures in the interconnect layer. Neighboring interconnect layers separated by planar vias may include communication lines that are perpendicularly oriented with respect to each of the neighboring interconnect layers. The nanotube structure may be chosen from a group comprising a polymer, carbon, and a composite material. A carbon nanotube film may be patterned in a metal layer to form the plurality of nanotube structures. A sputtered planar process may be performed across a trench of electrodes to create the carbon nanotube structures.

20 Claims, 10 Drawing Sheets

| PATH 602 | H LAYER 604 | | | | | | V LAYER 606 | | | | | | |
|---|---|---|---|---|---|---|---|---|---|---|---|---|---|
| | S1 | S2 | S3 | S4 | S5 | S6 | S1 | S2 | S3 | S4 | S5 | S6 |
| H₁ ↔ V₂ | 1 | 1 | 0 | 0 | 0 | 0 | 0 | 0 | 0 | 1 | 0 | 0 |
| H₃ ↔ H₄ | 0 | 0 | 0 | 1 | 1 | 1 | 0 | 0 | 0 | 0 | 0 | 0 |
| • • • | • • • | • • • | • • • | • • • | • • • | • • • | • • • | • • • | • • • | • • • | • • • | • • • |

TABLE 600

PROGRAMMABLE NANOTUBE INTERCONNECT

CLAIM OF PRIORITY

This is a divisional application of application Ser. No. 11/286,546 titled 'PROGRAMMABLE NANOTUBE INTERCONNECT' filed Nov. 23, 2005 now U.S. Pat. No. 7,494,842. This application is incorporated herein by reference.

FIELD OF TECHNOLOGY

This disclosure relates generally to the technical fields of semiconductor devices, and more particularly, to power management, power segmentation, and interconnect fabric of an integrated circuit.

BACKGROUND

Conventional power management techniques (e.g. setting power of a voltage region) in an integrated circuit are static in nature (e.g., determined during a design phase). One such technique may involve using a low-voltage integrated circuit to reduce an amount of power required. However, this may reduce the integrated circuit's performance (e.g., maximum operable frequency may be lower).

Another technique involves assigning multiple pre-determined power regions with power regulators (e.g., to create different voltage levels on different parts of the integrated circuit). Multiple pre-determined power regions may be formed by combining lower and/or higher voltage circuits in the integrated circuit using custom power planes. In this case, expensive custom masks and/or specialized circuits that have a fixed association with a specific voltage plane may be required.

The integrated circuit may draw significant power even when not in use because of the static power management of conventional techniques. Also, leakage (e.g., undesired current that flows when a transistor is in the "off" state; for example, MOS/CMOS devices using ultra-thin gate oxide leakage current is primarily a tunneling current across the gate oxide) may reduce battery life of a device incorporating the integrated circuit, and/or may cause overheating of the integrated circuit.

SUMMARY

Programmable nanotube interconnect is disclosed. In one aspect, a method includes forming a interconnect layer using a plurality of nanotube structures, and automatically altering a route of an integrated circuit based on an electrical current applied to at least one of the plurality of nanotube structures in the interconnect layer. Neighboring interconnect layers separated by planar vias may include communication lines that are perpendicularly oriented with respect to each of the neighboring interconnect layers. The nanotube structure may be chosen from a group comprising a polymer, carbon, and/or a composite material.

The route in a metal layer may be altered when a current is applied to at least one of the nanotube structures. This may be done through an algorithm that considers the activity in the power region and/or other power regions of the integrated circuit. A carbon nanotube film may be patterned in a metal layer to form the plurality of nanotube structures. A sputtered planar process may be performed across a trench of electrodes to create the carbon nanotube structures. The trench may be formed with a depth of at least 10 nanometers and/or a width of at least 100 nanometers to encompass a bendable portion of the plurality of nanotube structures.

In another aspect, a microelectronic structure includes a transistor layer formed above a silicon substrate, a metal layer formed above the silicon substrate, and a programmable interconnect layer patterned in at least one of the metal layer and the silicon substrate to determine power allocation in a voltage region of the transistor layer. The programmable interconnect layer may include a trench of electrodes, a carbon nanotube structure sputtered across the trench, and a planar via coupled to a communication line associated with the carbon nanotube structure.

At least two of the programmable interconnect layers may be stacked adjacent to each other. A vertical via may link at least two of the programmable interconnect layers. A route in the metal layer may be formed when a current is applied to a carbon nanotube structure in the programmable interconnect layer, and a configuration of the route may be performed based on an algorithm that considers the activity in the voltage region and other voltage regions of the integrated circuit.

In yet another aspect, a system includes an upper interconnect layer having a plurality of upper nanotube switches oriented in a horizontal communication line, a lower interconnect layer having a plurality of lower nanotube switches oriented in a vertical communication line, a plurality of vias to communicatively couple to the horizontal communication line and the vertical communication line and/or to provide a buffer space between the upper interconnect layer and the lower interconnect layer.

The upper nanotube switches and/or the lower nanotube switches may be programmable based on an algorithm applied by a data processing system associated with an integrated circuit incorporating the upper interconnect layer and/or the lower interconnect layer. The upper and lower nanotube switches may be associated with a voltage region in a transistor layer of an integrated circuit. A utilization rate of the voltage region may be monitored on a periodic interval by the integrated circuit, such that the algorithm is processed when the utilization rate drops below a minimum threshold.

The methods may be executed in a form of a machine-readable medium embodying a set of instructions that, when executed by a machine, cause the machine to perform any of the operations disclosed herein. Other features will be apparent from the accompanying drawings and from the detailed description that follows.

BRIEF DESCRIPTION OF THE DRAWINGS

Example embodiments are illustrated by way of example and not limitation in the Figures of the accompanying drawings, in which like references indicate similar elements and in which.

Other features of the presents will be apparent from the accompanying drawings and from the detailed description that follows.

DETAILED DESCRIPTION

Programmable nanotube interconnect is disclosed. In the following description, numerous specific details are set forth in order to provide a thorough understanding of various embodiments. It will be evident, however, to one skilled in the art that the various embodiments may be practiced without these specific details. An example embodiment provides methods, structures, and systems to form multiple power regions (e.g., specific power regions for diffused microprocessor, memories, etc.) in an integrated circuit using a nanotube structure and a plurality of power sources.

Another example embodiment provides methods, structures, and systems to manage power consumption of the multiple groups of transistors (e.g., at a fabrication level as well as post the fabrication level) to minimize leakage in the integrated circuit by configuring and/or programming the nanotube structure and/or the plurality of power sources. In yet another example embodiment, methods, structures, and systems are introduced to form a route based on a programmable interconnect layer having a plurality of the nanotube structures. It will be appreciated that the various embodiments discussed herein may/may not be the same embodiment, and may be grouped into various other embodiments not explicitly disclosed herein.

Figure 1:
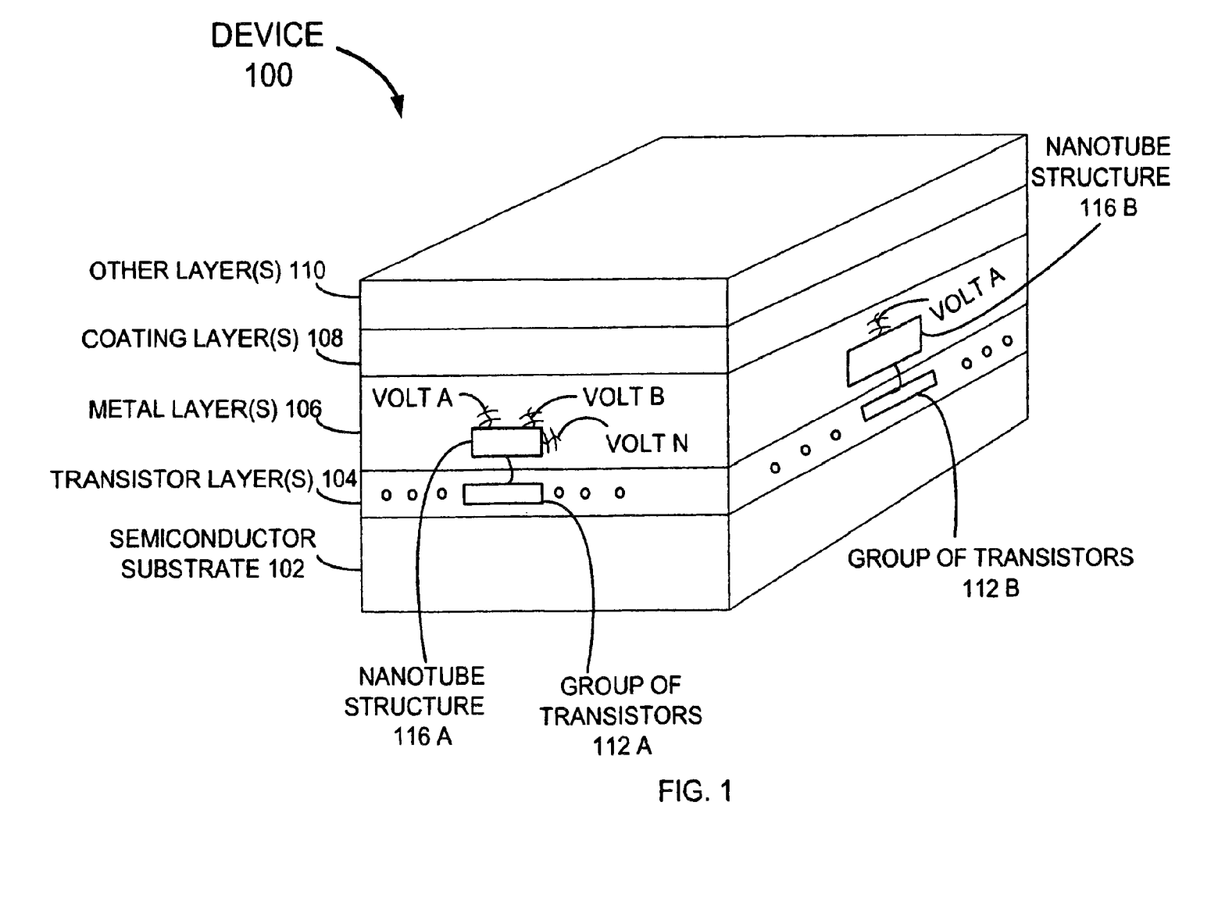
FIG. 1 is a three-dimensional inner view of a device having a nanotube structure, according to one embodiment.

FIG. 1 is a three-dimensional inner view of a device 100 (e.g., a microelectronic assembly) having nanotube structures 116, according to one embodiment. In FIG. 1, the device 100 is formed to include a semiconductor substrate 102, a transistor layer 104, any number of metal layers 106, an optional coating layer 108, and other layers 110 (e.g., formed one above another). In one example embodiment, a nanotube structure 116A patterned in the metal layers 106 may be coupled to a group of transistors 112A (e.g., the power region may be a circuit that performs a function, and which includes transistors that perform a particular function) having a plurality of transistors through a voltage line (connector between the nanotube structure 116 and the group of transistors 112). It should be noted that nanotube structure 116B may be formed in one or more of the metal layers 116. In alternate embodiments, the nanotube structure 116A may be patterned in the semiconductor substrate 102. Also illustrated in FIG. 1, the nanotube structure 116B is connected to a group of transistors 112B having the plurality of transistors through a voltage line (e.g., connector between the nanotube structure 116B and the group of transistors 112B).

In one embodiment, the nanotube structures 116 of FIG. 1 are cylindrical carbon molecules which exhibit extraordinary strength and unique electrical properties. The nanotube structures 116 may include at least one end capped with a hemisphere of a buckyball structure (e.g., spherical shape). In one embodiment, a diameter of a nanotube structure 116 is less than 5 nanometers. In one embodiment, the nanotube structures 116 may be either single-walled nanotubes (SWNTs) and/or multi-walled nanotubes (MWNTs) depending on the application and properties desired.

The nanotube structures 116 may be composed entirely of $sp^2$ bonds, similar to graphite. The nanotube structures 116 may align themselves into "ropes" held together by Van der Waals forces (e.g., intermolecular forces that deal with forces due to the polarization of molecules). If one or more of the nanotube structures 116 are SWNTs, they may have a diameter of close to 1 nm, with a tube length that can be many thousands of times larger (e.g., a structure of a SWNT can be conceptualized by wrapping a one-atom-thick layer of graphite into a seamless cylinder). The nanotube structures 116 may have a tensile strength of 63 GPa and may have an elastic modulus, in the order of 1 Tpa.

Under excessive tensile strain, the nanotube structures 116 may undergo plastic deformation (e.g., a permanent and/or semi-permanent deformation). The structure of the nanotubes 116 may affect their electrical properties. For a given (n=m) nanotube structure 116 of FIG. 1, if 2n+m=3q (where q is an integer), then the nanotube structure 116 is metallic, otherwise the nanotube is a semiconductor. Thus all armchair (n=m) nanotubes may be metallic, and nanotubes (5,0), (6,4), (9,1), etc. may all be semiconducting. An alternative (equivalent) representation of this condition is if (n=m)/3=integer, then the SWNT may be metallic. In theory, metallic nanotubes can have an electrical current density more than 1,000 times stronger than metals such as silver and copper. The nanotube structures 116 may thermal conductors along the tube, (e.g., exhibiting a property known as "ballistic conduction") but good insulators laterally to the tube axis.

The nanotube structures 116 of FIG. 1 may have conductive properties that make them ideal components of electrical circuits. In one embodiment, the nanotube structures 116 of FIG. 1 are grown through a chemical vapor deposition process (e.g., a process for depositing thin films of various materials, such as when substrate is exposed to one or more volatile precursors, which react and/or decompose on the substrate surface to produce the desired deposit) from patterned catalyst material on a wafer, which serve as growth sites and allow designers to position one end of the nanotube. During the deposition process, an electric field can be applied to direct the growth of the nanotubes, which tend to grow along the field lines from negative to positive polarity. The nanotube structures 116 may be self assembled using chemical or biological techniques to place the nanotubes from solution to determinate place on a substrate. Alternatively, in another embodiment, the nanotube structures 116 of FIG. 1 are manipulated with an atomic force microscope.

The nanotube structures 116 may be formed based on a sputtered planar process (e.g., adhering a thin film on a layer) performed in a trench (e.g., with a depth of at least 10 nanometer which may allow a nanotube material of the nanotube structure 116A to flex) on the semiconductor substrate 102 (e.g., the nanotube structure 116B may be formed in the metal layers 106 using a similar process). For example, in one embodiment, the nanotube structures 116 are created through a physical process whereby atoms in a solid target material (e.g., carbon) are ejected into the gas phase due to bombardment of the material by energetic ions (e.g., thin-film deposition).

The sputtered atoms (e.g., of carbon), and/or those ejected into the gas phase, may not be in their thermodynamic equilibrium state. Therefore, they may condense back into the solid phase (e.g., to form the nanotube structures 116 of FIG. 1) upon colliding with any surface in the sputtering chamber (e.g., a patterned wall in the semiconductor substrate 102 of FIG. 1). This may result in deposition of the sputtered material (e.g., carbon) on all surfaces inside the chamber (e.g., to deposit thin films of carbon material to form the nanotube structures 116 of FIG. 1).

At least one power source (e.g., not shown) may be attached to the nanotube structure 116A to provide power to a power region (e.g., the group of transistors 112A) in the transistor layer 104 (e.g., the at least one power source may be attached to the section of the transistor layer 104 having the nanotube structure 116B adjacent to at least one of the metal layers 106 to form the group of transistors 112B).

One or more power sources may be connected to the group of transistors 112 when the nanotube structures 116 are bent (e.g., indicating "on" state, may be bent when a current is applied to the nanotube structures 116), whereas the at least one power source may be disconnected from the group of transistors 112 when the nanotube material of the nanotube structures 116 is unbent (e.g., indicating "off" state, e.g., when the current is removed from the nanotube structures 116, and/or reapplied). This concept will be described in greater detail in FIG. 2 and in FIG. 3. The "on" and "off" state of the nanotube structures 116 may be configured when the nanotube structures 116 receive a command from a data processing system. The device 100 may have a plurality of power sections based on a state of the nanotube structures 116 and/or one or more power sources.

In another example embodiment, the device 100 may programmatically manage power (e.g., electricity) allocation to the group of transistors 112. The state of nanotube structures 116 (e.g., having a tensile strength of at least 63 GPa and/or an elastic modulus of at least 1 TPa) may be altered based on an algorithm of an application program (e.g., software and/or hardware) associated with the device 100.

In yet another embodiment, the device 100 may include a programmable interconnect layer (e.g., a programmable interconnect layer 500 of FIG. 5) patterned in at least one of the metal layers 106 and/or the semiconductor substrate 102 to determine power allocation in the group of transistors 112 of the transistor layer 104 and provide a programmable routing based on the nanotube structures 116.

Figure 2:
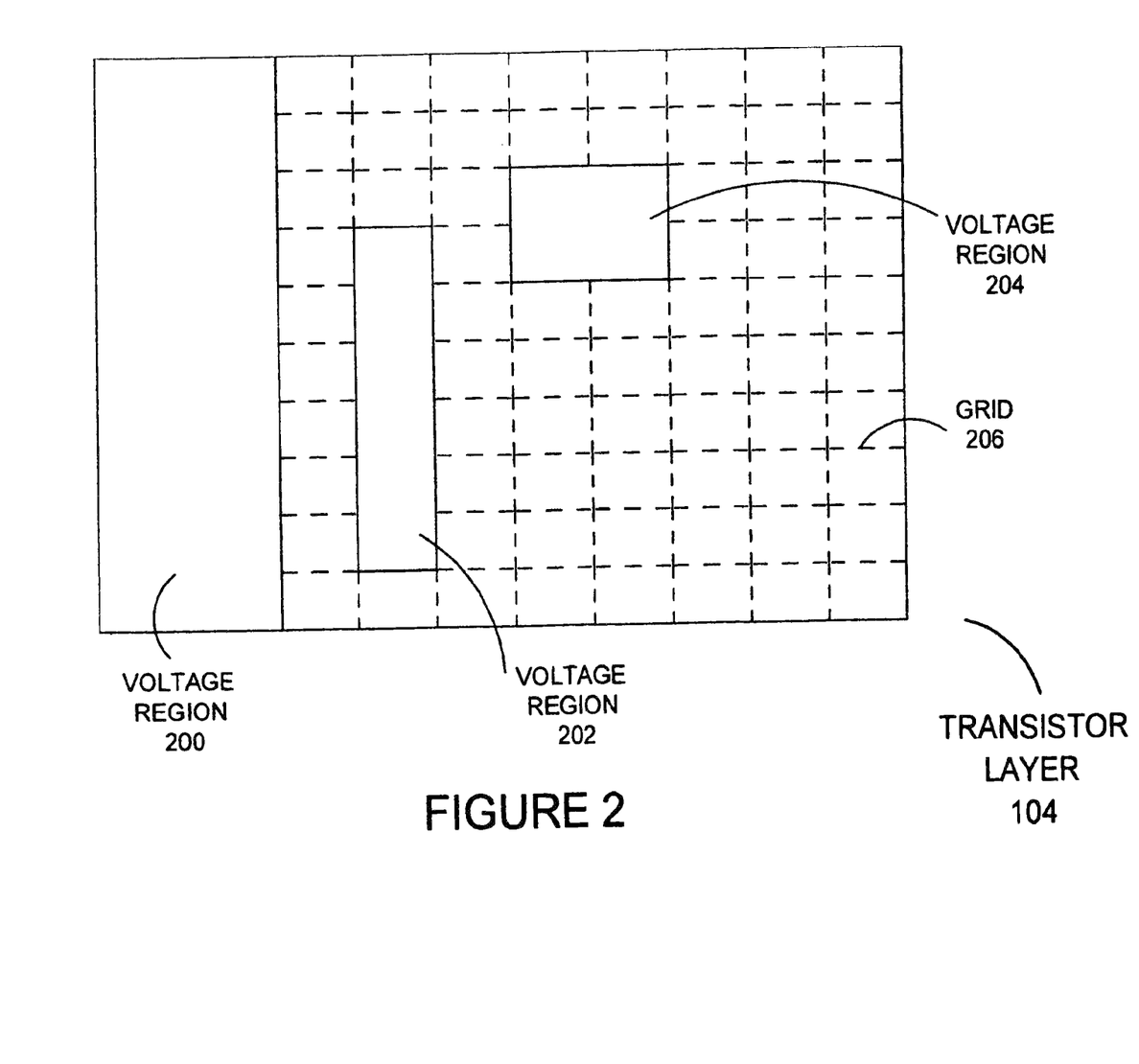
FIG. 2 is a cross-sectional view of the transistor layer having a plurality of voltage regions, according to one embodiment.

FIG. 2 is a cross-sectional view of the transistor layer 104 having a plurality of voltage regions, according to one embodiment. In FIG. 2, the transistor layer 104 of FIG. 1 may have the plurality of voltage regions with an interconnected set of grid 206 (e.g., each square in the grid may include 1 million transistors for example)). Each of the plurality of voltage regions may be allocated for a group of transistors reserved for a specific function (e.g., a voltage region 200 of transistors forming memory devices, a voltage region 202 forming registers, a voltage region 204 forming a microprocessor, etc.). The voltage regions may be formed at a design level and/or at a fabrication level. A current may be applied to a nanotube structure (e.g., the nanotube structure 116A of FIG. 1), to provide power to the voltage region 202 in one example. Alternatively, power to the voltage region 204 may be removed when the transistors in the voltage region 204 are not being utilized (e.g., the nanotube structure 116B may be uncoupled from a metal plate).

Figure 3:
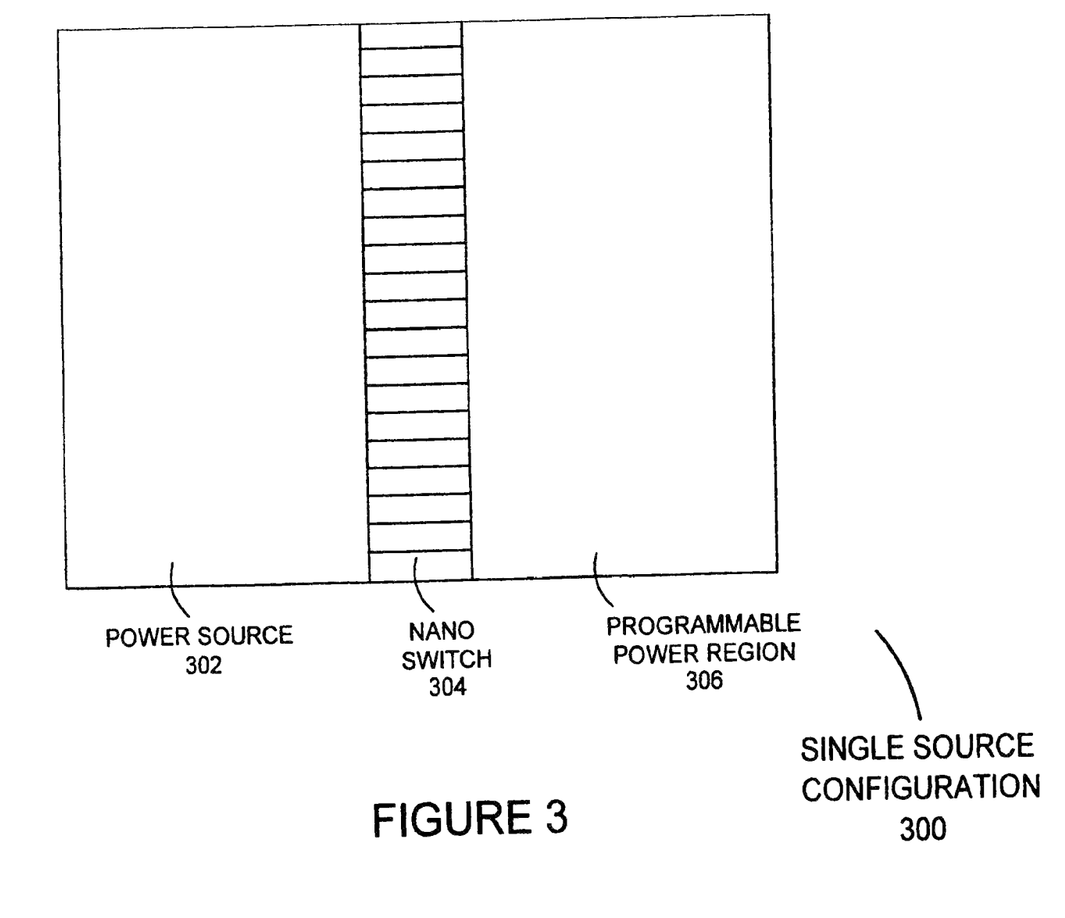
FIG. 3 is a perspective view of a single power source configuration coupled to a programmable power region using a nano-switch, according to one embodiment.

FIG. 3 is a perspective view of a single power source 302 coupled to a programmable power region 306 using a nano-switch 304 (e.g., a carbon nanotube switch and/or CNT switch), according to one embodiment. In FIG. 3, which displays a single source configuration 300, the power source 302 and/or the nano-switch(s) 304 (e.g., an embodiment of the nanotube structures 116 of FIG. 1) may be configured at a fabrication level and/or programmed post the fabrication level to set up a power (e.g., voltage) in the programmable power region 306. When a current is applied to the nano-switch 304, the power source 302 may be electrically connected with the programmable power region 306. The programmable power region 306 may be isolated from the single power source 302 when the nano-switch 304 is turned off (e.g., thereby minimizing leakage when transistors in the programmable power region 306 are not in use). It should be noted that other effective topologies are possible and this embodiment is an example.

There are two states (e.g., a binary state determined by a current applied to the nanotube structure 116) of power when the single power source 302 is coupled to the programmable power region 306. In one example embodiment, a system consisting of the integrated circuit having the nanotube structures 116 patterned on it and a hardware and/or a software device to control the nanotube structures 116 may be used to allocate multiple power sources in the integrated circuit (e.g., as will be later described in FIG. 4). The multiple power regions may be associated/formed based on the settings of the programmable carbon nanotube structure 116 (e.g., carbon nanotube switch patterned adjacent to the transistor layer 104 and at least one power source (e.g., the nano-switch 304 made of a planar carbon nanotube film patterned on the integrated circuit which form electrically programmable persistent mechanical switches).

Figure 4:
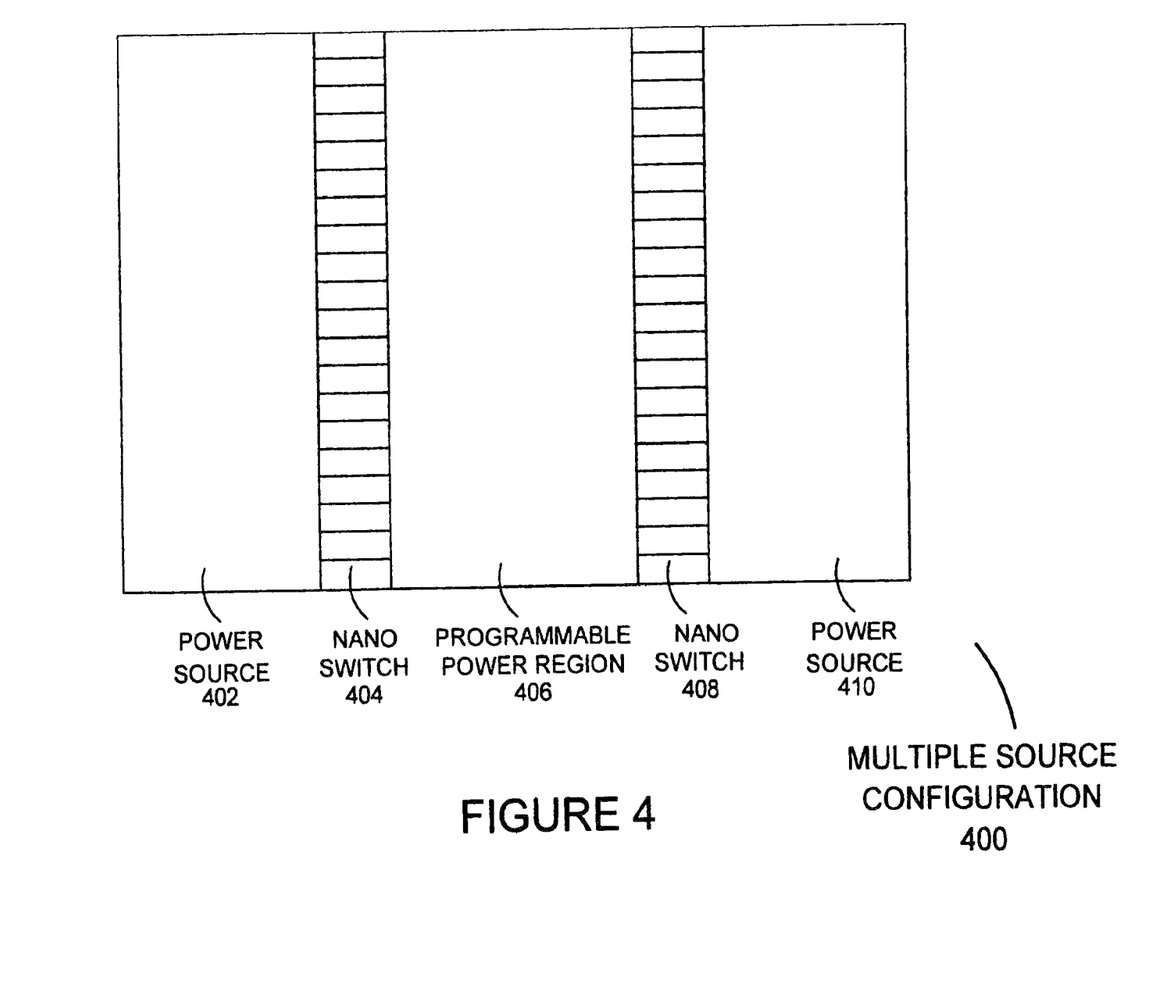
FIG. 4 is a perspective view of a multiple source configuration having two power sources coupled to a programmable power region using a nano-switch, according to one embodiment.

FIG. 4 is a perspective view of a multiple source configuration 400 having two power sources (e.g., a power source 410 and a power source 412) coupled to a programmable power region 406 using nano-switches 404 and nano-switches 408, according to one embodiment. While two power sources are shown FIG. 4, alternate embodiments may include any number of power sources associated with the programmable power region 406. When a voltage of the programmable power region 406 is to be configured, the nano-switch 404 is turned off to disengage all power sources (e.g., the power source 410 and the power source 412) from the programmable power region 406. Next, the nano-switch 404 is configured and/or programmed to set up the voltage (e.g., high, low, or off state for the power region 406 having the two power sources).

For the high state, the nano-switches 404 may be turned on while the nano-switches 408 turned off to connect the power source 402 (e.g., having a higher voltage than the power source 410) to the programmable power region 406. For the low state, the nano-switches 408 may be turned on while the nano-switch 404 is tuned off to connect the power source 410 (e.g., having a lower voltage than the power source 412) to the programmable power region 406. For the off state, both the nano-switches 404 and the nano-switches 408 may be turned off to disengage both the power source 402 and the power source 410 from the programmable power region 406 to minimize leakage by transistors in the programmable power region 406. In an alternate embodiment, the current capacity of multiple power sources (e.g., the power source 402 and the power source 410) may be cascaded (e.g., summed, aggregated, etc.) together to provide incremental current to the programmable power region 406 when both the nano-switch 404 and the nano-switch 408 are turned on (e.g., the nanoswitch 404 and/or the nanoswitch 408 may be bent into a conductive surface to signal an "on" state on when current is applied to them).

The groups of transistors 112 of FIG. 1, the programmable power region 306 of FIG. 3, and/or the programmable power region 406 of FIG. 4 may be managed by a system having a power management module (e.g., hardware and/or software circuitry) to manage performance of the group of transistors using at least one carbon nanotube film based switch and a data processing system. The power management module may be as simple as a register interface with flops that drive changes is state of a device (e.g., integrated circuit or portion of an integrated circuit). For example, if the device has 64 controllable power regions it could be controlled with 6 I/O's. Another example in a device that has 64 controllable power regions it could be controlled with as few as 6 bits of register. If a device had 256 controllable power regions it could be controlled with 8 bits of register data. The decode of these bits would drive one value of the decode to the CNT switches in each power region to set their state. Another simple scenario is to have a single register bit for each power region and drive the value to the CNT switches in each power region. Clearly the this control module would be independent the power region (e.g., group of transistors) under its control. These are the simplest cases where there is one power source and the selection is power on or power off. Clearly more sophisticated interfaces are easily imagined. In the case of an "on device" application the module could be extended to include logic that would monitor the device and change the configuration based on that monitoring or external commands. In the case of an "off device" application the application could monitor the device and other criteria to set the desired power configuration via an exposed interface.

In one embodiment, the data processing system (e.g., an integrated circuit and/or a portion of the transistor layer) may determine a utilization rate of the group of transistors on a periodic interval and may communicate a signal to the group of transistors when the utilization rate drops below a minimum threshold (e.g., may toggle a state of the at least one carbon nanotube based switch). In addition, based on the utilization rate of the group of transistors, power allocation to the group of transistors may be changed/altered.

Figure 5:
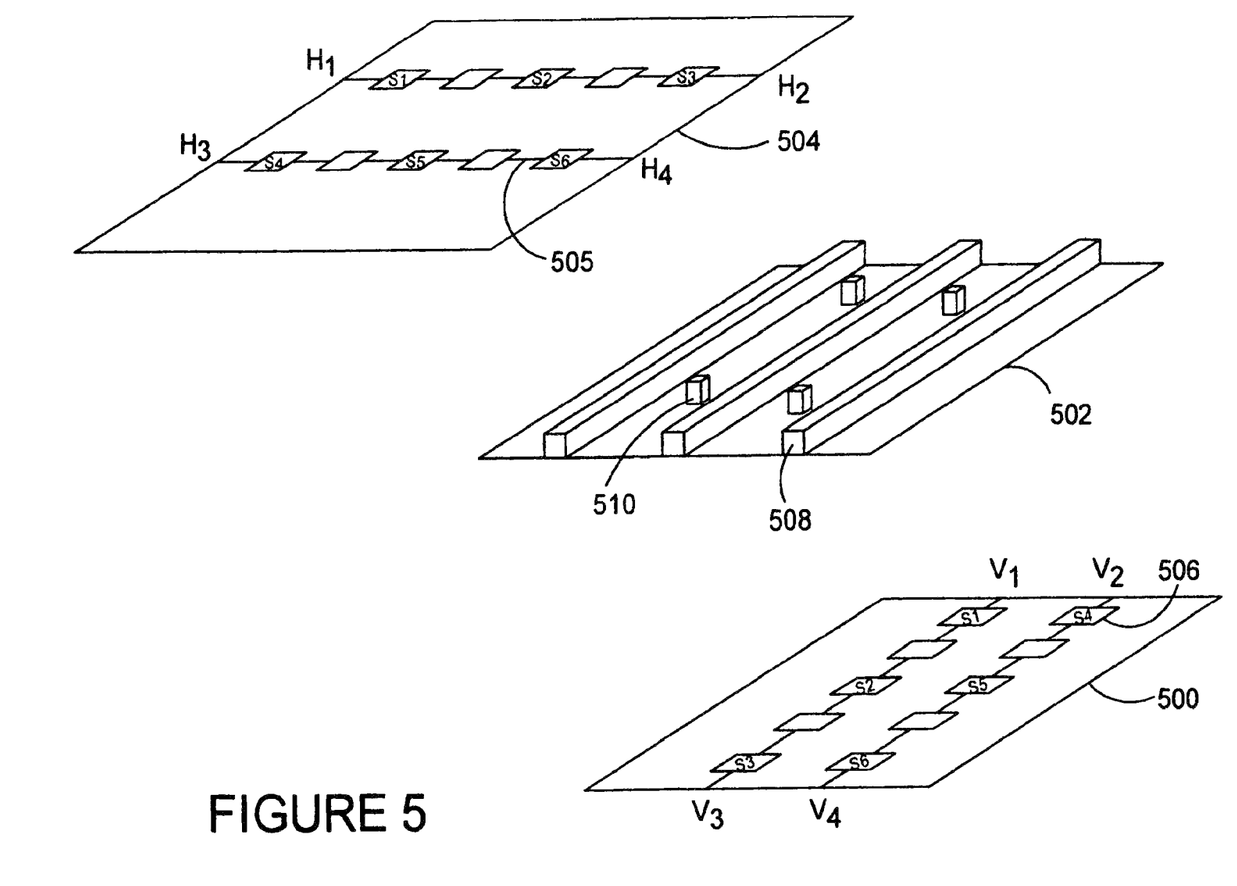
FIG. 5 is a componential view of programmable interconnect layers having the nanotube structure as a switch, according to one embodiment.

FIG. 5 is a componential view of an interconnect layer 500 and an interconnect layer 504 each including the nanotube structures 116 in the form of switches 506. For example, the interconnect layer 500 and the interconnect layer 504 each include a S1, S2, S3, S4, S5, and an S6 switch. In FIG. 5, an interconnect layer 500 (e.g., patterned to at least one of the metal layers 106 and/or the semiconductor substrate 102 to control power allocation in the group of transistors 112) may include a trench of electrodes. The nanotube structures 116 may be sputtered across the trench. A planar via 505 may be coupled to a communication line (e.g., that carries an electrical signal, an optical signal, etc.) associated with the nanotube structure 116 (e.g., the switches 506). The nanotube structures 116 may be composed of at least one switch 506 (e.g., among S1, S2, S3, S4, S5, and S6 of FIG. 5) embedded in the interconnect layer 500. A planar via (e.g., four of which are shown between each of the switches the interconnect layer 500) may provide a connection point for two switches (e.g., thus, the interconnect layer 500 is illustrated as including 4 planar vias for six switches 506).

The programmable interconnect layer of 504 is a similar to the programmable interconnect layer 506 except that it has the nanotube structure 116A/116B oriented perpendicular to the nanotube structure 116A/116B of the programmable interconnect layer 506 (e.g., having the 4 planar vias for the six switches 506). The infrastructure layer 502 (e.g., a layer with structural elements that provide a framework for supporting the programmable interconnect structure 500 and the programmable interconnect structure 504) may be composed of a switch infrastructure 508 (e.g., a spacer) and a vertical via 510 which connects two corresponding planar vias to each other.

In one example embodiment, the programmable interconnect structure 504 may be stacked on top of the programmable interconnect structure 500 when the infrastructure layer 502 is placed in between to couple the planar vias of the two programmable interconnect structures using the vertical vias 510. A route in the metal layers 106 (e.g., of FIG. 1) may be formed when a current is applied to at least one of the switches (e.g., at least one of S1, S2, S3, S4, S5, and S6, each being a nanotube structure) in the programmable interconnect layer 500/504. Furthermore, a configuration of the route may be formed based on an algorithm associated with the state and/or activity in the group of transistors 112 of the integrated circuit.

Figure 6:
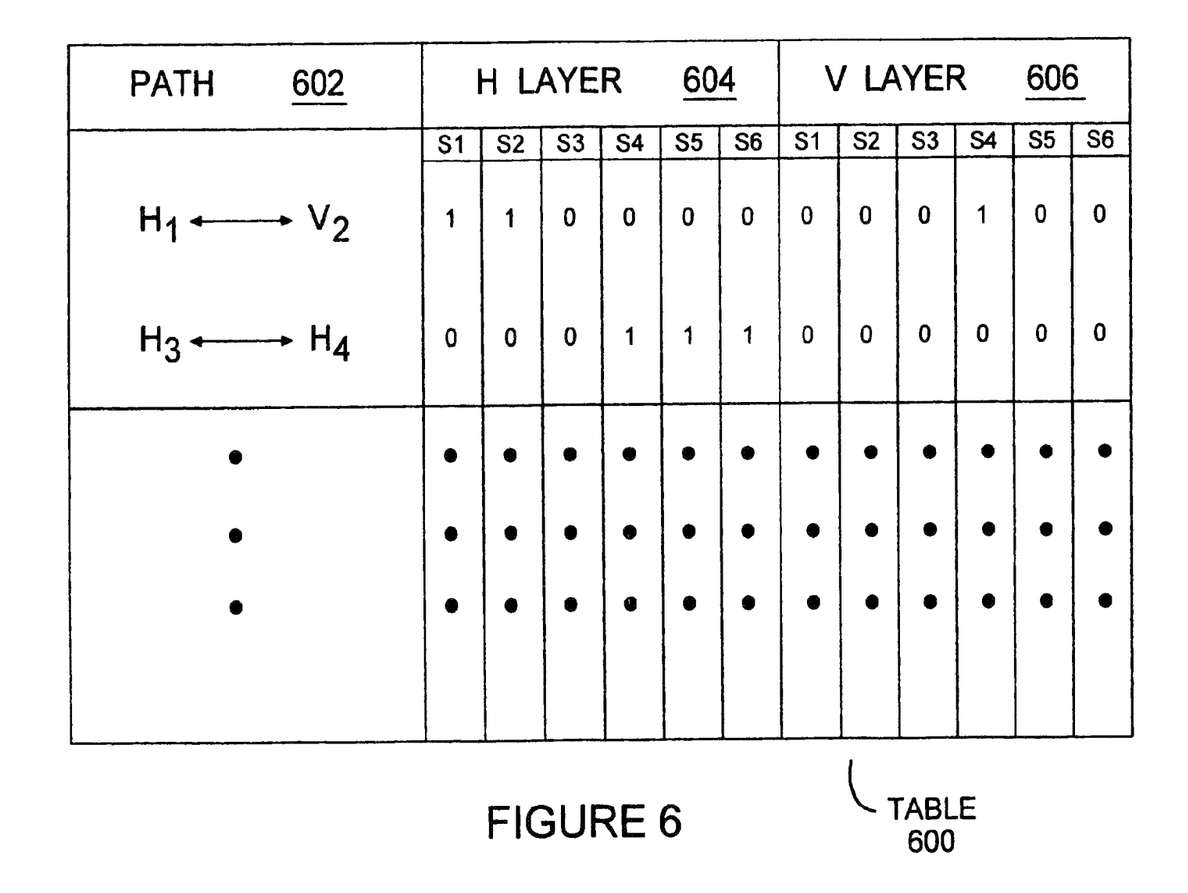
FIG. 6 is a table view of routing paths that may be configured in the programmable interconnect layers of FIG. 5, according to one embodiment.

FIG. 6 is a table view of routing paths 600 that may be configured in the programmable interconnect layers 500/504, according to one embodiment. The table view of routing path 600 may include a path 602, a H Layer 604 (e.g., an upper layer), and a V Layer 606 (e.g., a lower layer). In one example system, the routing paths may be formed when an upper interconnect layer having a plurality of nanotube structures oriented in a horizontal communication line is coupled to a lower interconnect layer having the plurality of nanotube structures oriented in a vertical communication line by a plurality of vertical vias 510 that connect the planar vias of the upper and lower interconnect layer. Based on the system, a routing path from H1 to V2 may be formed when S1 and S2 of the H Layer 604 and S4 of the V Layer 606 are turned on while the remaining switches are turned off. In another routing path which connects H3 to H4, only S4, S5, and S6 of H Layer 604 may be turned on.

The switches in the upper and lower interconnect layers (e.g., the switches associated with the group of transistors 112 as illustrated in FIG. 1) may be programmable based on an algorithm applied by a data processing system associated with the integrated circuit. The algorithm may be processed when a utilization rate (e.g., monitored on a periodic interval by the integrated circuit) drops below a minimum threshold.

Figure 7:
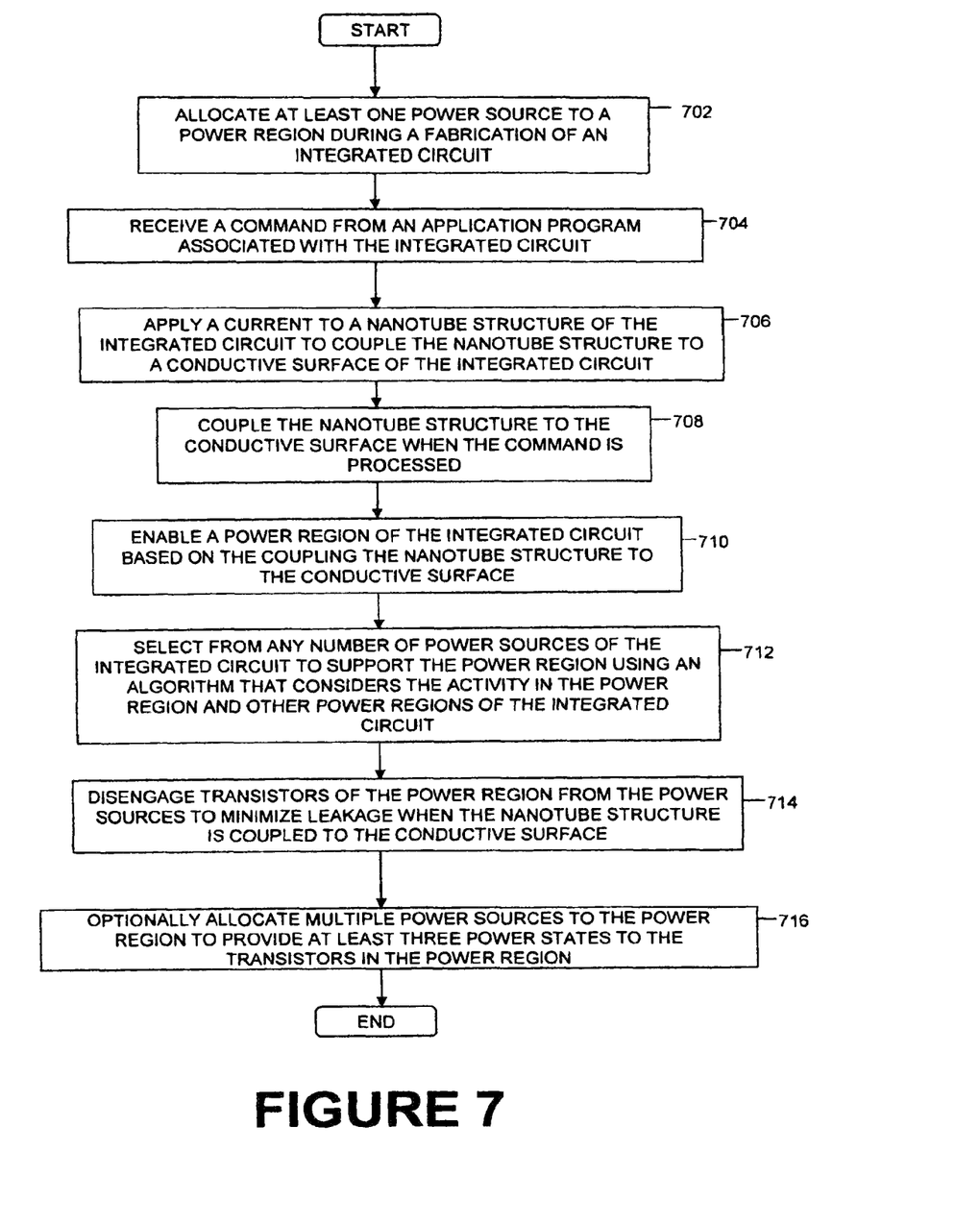
FIG. 7 is a process flow to manage the group of transistors of FIG. 1 using the nanotube structure, according to one embodiment.

FIG. 7 is a process flow to manage the group of transistors 112A/112B of FIG. 1 using the nanotube structure 116A/116B (e.g., formed from a planar carbon nanotube film that is patterned and associated with a voltage input of a group of transistors forming the group of transistors 112A/112B), according to one embodiment. In operation 702, at least one power source (e.g., selectable based on frequency of the integrated circuit and at least one other command received from an application program) may be allocated to the group of transistors 112A/112B of FIG. 1 during fabrication of the integrated circuit. The application program can monitor the power usage characteristics of the integrated circuit (e.g., device) as well as override the characteristics as determined by the application. For example, if a section of a device is effectively configured to be always unused, the application may send a command to disengage that portion of the device from its power source to save power. In another embodiment, if it is determined that the work load of the integrated circuit is such that only a fraction of its overall capacity is needed, the integrated circuit might be shifted to a lower voltage/lower frequency combination until more capacity is required.

In another example, when more power is needed than is normal, the integrated circuit may a have a configuration where it needs to increase the overall power available to a specific power region. One or more additional power source(s) may be added to an existing one to yield additional current capacity associated with a particular region. Thus a command may be received from an application associated with the integrated circuit, and the integrated circuit may process the command to alter the power configuration of the integrated circuit. This application may reside within the integrated circuit itself or be external to the integrated circuit or both. It is presumed that the application will monitor conditions of interest and adjust the power configuration as needed. This monitoring may be based on a utilization rate of the power region. The utilization rate may be monitored on a periodic interval by the integrated circuit, and the command may be processed when the utilization rate drops below a minimum threshold.

At least one power source may be allocated to the power region during a fabrication of the integrated circuit. The power source may be selected based on frequency of the integrated circuit and/or at least one other command received from the application program.

The integrated circuit in operation 704 may receive a command based on a utilization rate (e.g., which is monitored on a periodic interval by the integrated circuit) of the group of transistors 112A/112B from the application program.

In operation 706, the command (e.g., in a form of current that may be processed when the utilization rate drops below a minimum threshold) may be applied to couple the nanotube structure 116A/116B to a conductive surface. In operation 708, coupling of the nanotube structure 116A/116B (e.g., made of a material chosen from a group comprising a polymer, a carbon, and/or a composite material) to the conductive surface may take place when the command is processed.

The coupling of the nanotube structure 116A/116B to the conductive surface may result in an enablement (e.g., may be performed during an activation sequence of the integrated circuit) of the group of transistors 112A/112B of the integrated circuit according to operation 710. This coupling may enable a selection of one or more power segments. The nanotube structure 116A/116B (e.g., a configurable/programmable carbon nanotube switch based structure) can be made to be programmable within the device. This requires the nanotube structure 116A/116B to be accessible to be configured/programmed by as portion of the device itself (e.g., can be accomplished by treating the devices like a memory element and making each group of nanotube structures/switches within a power segment group addressable). This control is then made available by the device to be controlled via a command interface. When commands are processed, sections of the integrated circuit may be configured to be part of no power plane or 1 of n power planes. This may be accomplished via configuring/programming the switches.

In operation 712, one or more of power sources may be selected to support the group of transistors 112A/112B using an algorithm that considers an activity in the group of transistors 112A/112B of FIG. 1. When transistors in the group of transistors 112A/112B are not in use, the nanotube structure 116A/116B in operation 714 may be turned off (e.g., thereby disengaging the power sources to the group of transistors 112A/B) to minimize leakage in the transistors. In operation 716, multiple power sources may be allocated to the group of transistors 112A/112B to provide at least three power states (e.g., a high state, a low state, and an off state).

Figure 8:
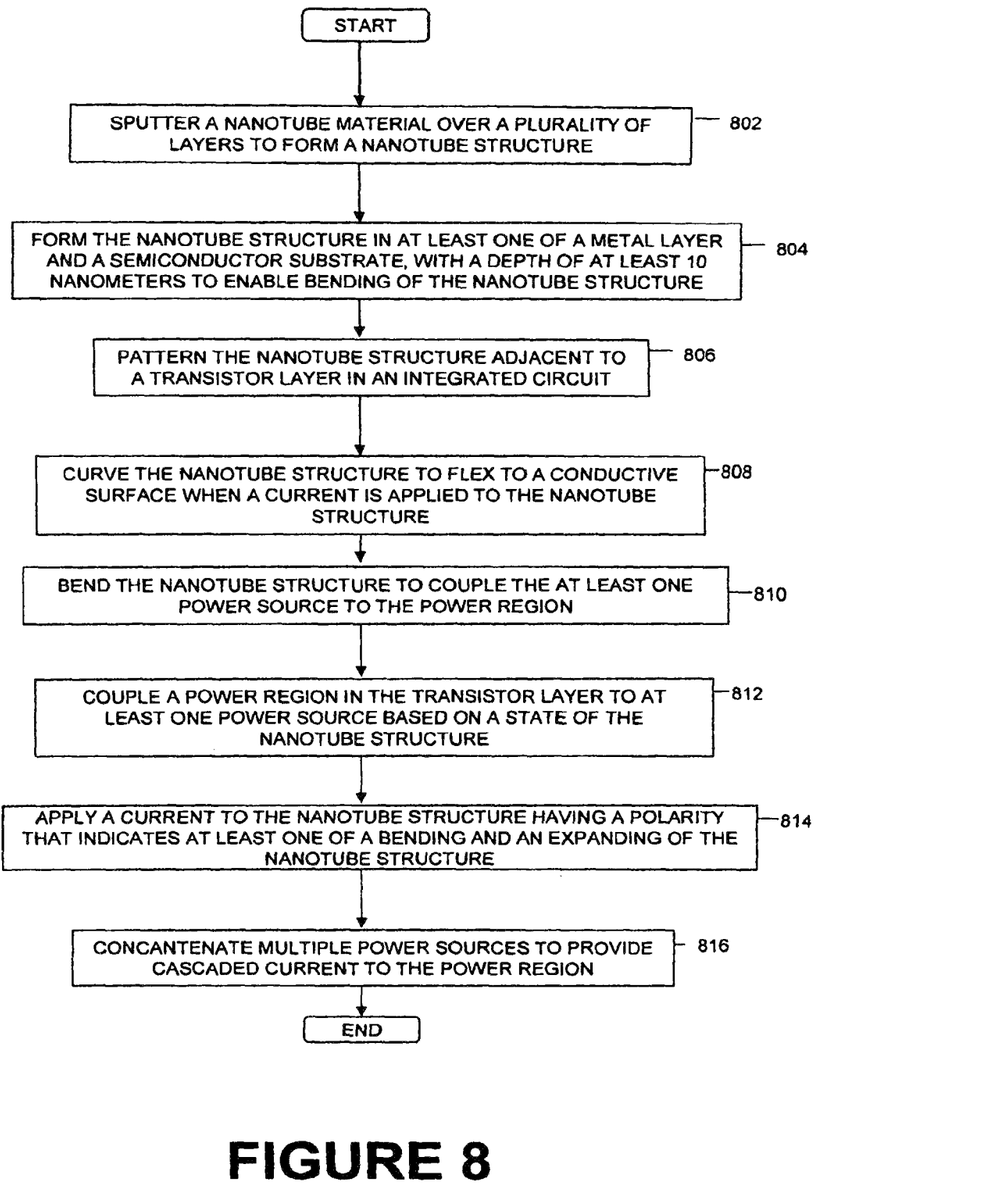
FIG. 8 is a process flow to form the power region of FIG. 1 using the nanotube structure, according to one embodiment.

FIG. 8 is a process flow to form the power region (e.g., having the group of transistors 112A/112B) of FIG. 1 using the nanotube structure 116A/116B (e.g., formed when a planar carbon nanotube film is patterned and associated with a voltage input of a group of transistors forming the group of transistors 112A/112B), according to one embodiment. In operation 802, a nanotube material may be sputtered over a plurality of layers to form the nanotube structure 116A/116B. The nanotube structure 116A/116B may be formed (e.g., with a depth of at least 10 nanometers to enable bending of the nanotube structure 116A/116B) adjacent to at least one of the metal layers 106 and the semiconductor substrate 102 in operation 804.

In operation 806, the nanotube structure 116A/116B may be patterned adjacent to the transistor layer 104. A bendable portion of the nanotube structure 116A/116B may be curved in operation 808 to flex to a conductive surface when the current is applied to the nanotube structure 116A/116B. In operation 810, the bendable portion may be bent to couple at least one power source to the group of transistors 112A/112B. In operation 812, the at least one power source may be coupled to the group of transistors 112A/112B based on a state (e.g., a binary state) of the nanotube structure 116A/116B.

In operation 814, the current is applied to the nanotube structure 116A/116B having a polarity that indicates at least one of a bending and an expanding of the nanotube structure 116A/116B. The group of transistors 112A/112B may be coupled to at least two power sources in operation 816 to provided cascaded current to the group of transistors 112A/112B. A plurality of group of transistors 112A/112B may be enabled in the integrated circuit having the nanotube structure 116A/116B patterned on them and at least one power source coupled to each of the plurality of group of transistors 112A/112B.

Figure 9:
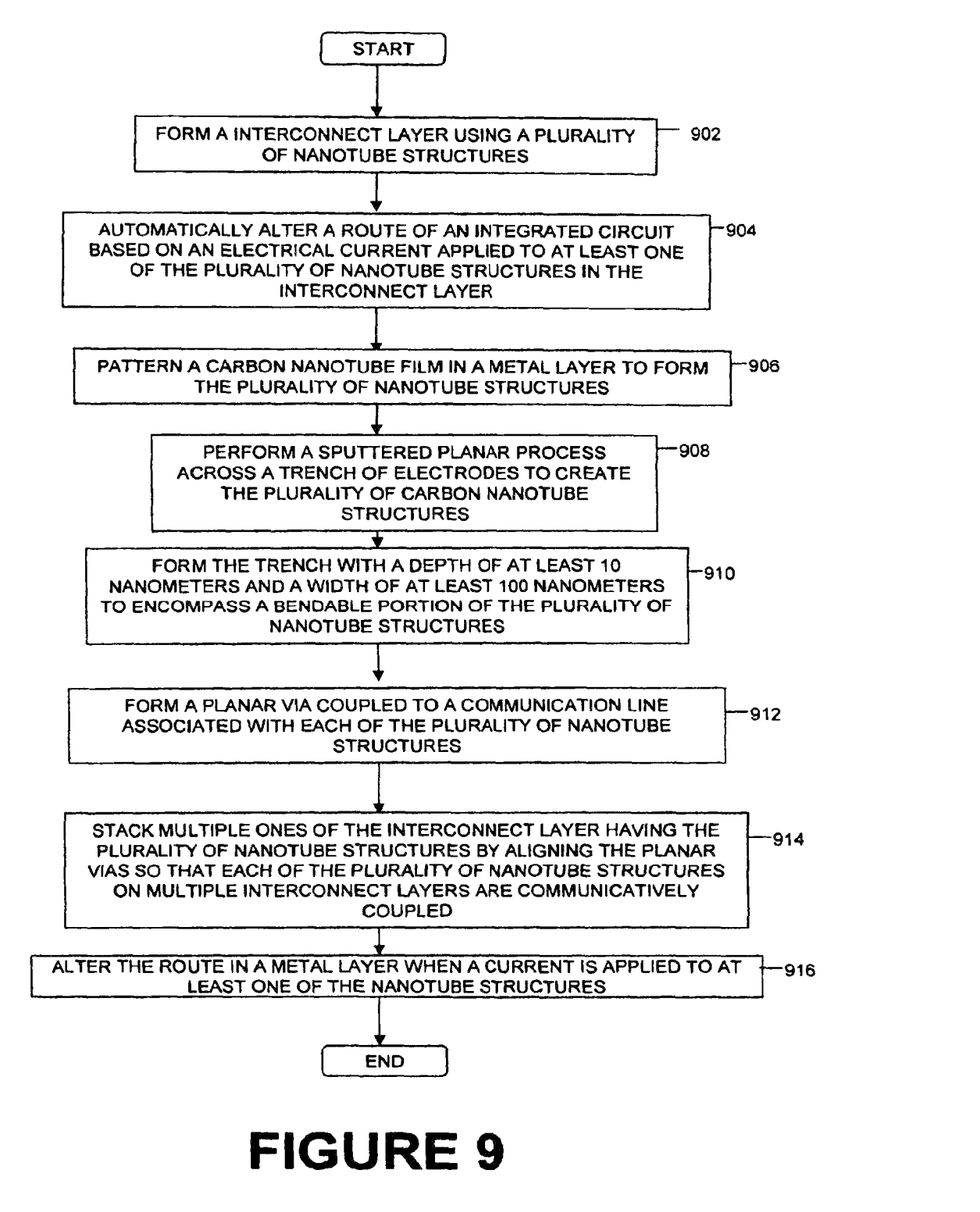
FIG. 9 is a process flow to form a programmable interconnect layer which provides a plurality of routing, according to one embodiment.

FIG. 9 is a process flow to form a programmable interconnect layer 500/504 which provides a plurality of routing, according to one embodiment. In operation 902, an interconnect layer 500 may be formed using a plurality of nanotube structures 506 (e.g., S1, S2, S3, S4, S5, and S6). The plurality of nanotube structures 506 of operation 904 may be used to alter a route when the current is applied to at least one of the plurality of nanotube structures 506. In operation 906, a carbon nanotube film may be patterned in the metal layers 106 to form the nanotube structures 506 (e.g., in a form of switch).

To create the nanotube structures 506, a sputtered planar process may be performed across a trench of electrodes in operation 908. In operation 910, the trench with a depth of at least 10 nanometers and a width of at least 100 nanometers may be formed to encompass the bendable portion of the plurality of nanotube structures 506. The planar via 505 coupled to a communication line associated with each of the plurality of nanotube structures 506 may be formed in operation 912.

In operation 914, interconnect layers 500/504 in multiple numbers may be stacked by aligning (e.g., to allow neighboring interconnect layers 500/504 separated by planar vias 505 include communication lines that are perpendicularly oriented with respect to each of the neighboring interconnect layers 500/504) the planar vias 505 so that each of the plurality of nanotube structures 506 is communicatively coupled. In operation 916, the route in the metal layers 106 may be altered when the current is applied to at least one of the nanotube structures 506 (e.g., through an algorithm that considers the activity in the group of transistors 112A/112B and other groups of transistors of the integrated circuit).

Figure 10:
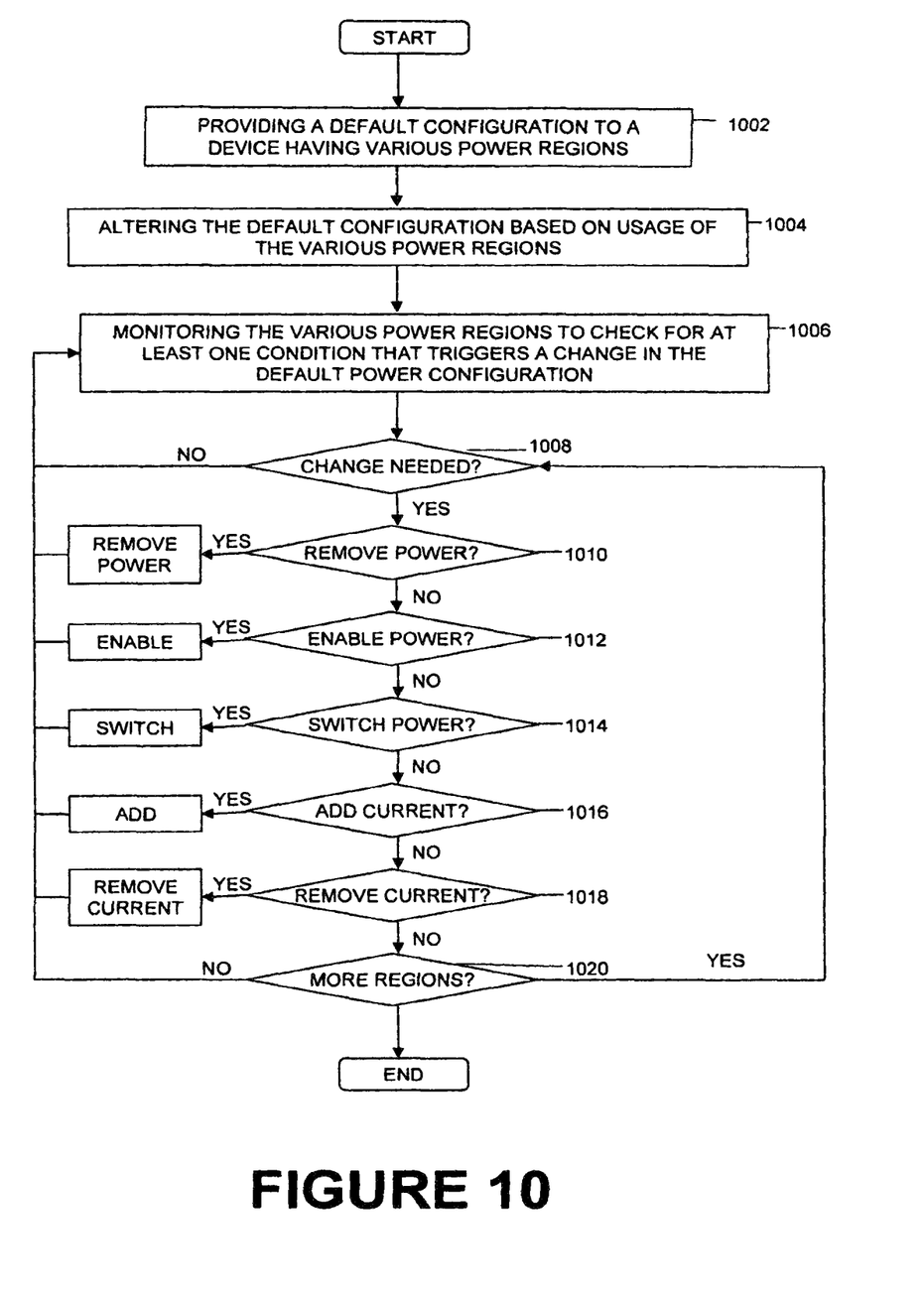
FIG. 10 is a process flow of a device to alter a change in a default power configuration, according to one embodiment.

FIG. 10 is a process flow of a device to alter a change in a default power configuration, according to one embodiment. In operation 1002, a default configuration may be provided to a device (e.g., the device 100) having various power regions (e.g., such as a power region formed by the group of transistors 116B). In operation 1004, the default configuration (e.g., a default configuration may be an initial allocation of power to the group of transistors 116B) can be altered based on usage (e.g., activity) of the various power regions. In operation 1006, various power regions can be monitored to check for at least one condition (e.g., a sleep state, a dormant activity of the group of transistors 116B, etc.) that triggers a change in the default power configuration. Then, in condition 1008, it is determined if a change is needed (e.g., a parameter governing activity level of the group of transistors 116B drops below a threshold level). If a chance is needed, then a number of conditions are monitored including whether power should be removed 1010, whether power should be enabled 1012, whether power should be switched to another source 1014, whether current should be added 1016, and/or whether current should be removed 1018. If any of these conditions are true, then the appropriate operations are performed (e.g., remove power, enable power, switch power, add power, and/or remove current as illustrated in FIG. 10). Then, in condition 1020, it is determined whether more regions need to be considered (e.g., power concatenated, modified, etc.).

The method displayed in FIG. 7, FIG. 8, FIG. 9, and FIG. 10 may be realized in a form of a machine-readable medium (e.g., a data processing system) embodying a set of instruction (e.g., a software program) that, when executed by a machine, causes the machine to perform the operations discussed herein.

Although the present embodiments have been described with reference to a specific example embodiment, it will be evident that various modifications and changes may be made to these embodiments without departing from the broader sprit and scope of the embodiments. For example, the various microelectronic assemblies, modules, and/or systems described herein may be performed and created using hardware circuitry of different material, firmware, software and/or any combination of hardware, firmware, and/or software (e.g., embodied in a machine readable medium).

In addition, it will be appreciated that the various methods, systems, structures, and/or assemblies disclosed herein may be embodied in a machine-readable medium and/or a machine accessible medium compatible with a data processing system (e.g., a computer system). Accordingly, the specification and drawings are to be regarded in an illustrative rather than a restrictive sense.

What is claimed is:

1. A method comprising:
forming a transistor layer directly above a semiconductor substrate, with an entire surface of the transistor layer directly contacting an entire surface of the semiconductor substrate;
forming a metal layer above the semiconductor substrate and directly above the transistor layer, with an entire surface of the metal layer directly contacting another entire surface of the transistor layer;
patterning a programmable interconnect layer within at least one of the metal layer and the semiconductor substrate to determine power allocation in a voltage region of the transistor layer, the programmable interconnect layer having a carbon nanotube structure configured to function as a switch based on a current applied thereto; and
enabling formation of a route in the metal layer through the programmable interconnect layer through applying the current to the carbon nanotube structure.

2. The method of claim 1, further comprising stacking at least two of the programmable interconnect layers adjacent to each other.

3. The method of claim 2, further comprising coupling at least two of the programmable interconnect layers through a vertical via.

4. The method of claim 1, further comprising utilizing the programmable interconnect layer as a pass gate and a memory element in the metal layer.

5. The method of claim 1, further comprising configuring the route based on an algorithm that considers an activity in the voltage region and other voltage regions of an integrated circuit.

6. An integrated circuit comprising:
a semiconductor substrate;
a transistor layer formed directly above the semiconductor substrate, with an entire surface of the transistor layer directly contacting an entire surface of the semiconductor substrate, the transistor layer having a plurality of voltage regions;
a metal layer formed above the semiconductor substrate and directly above the transistor layer, with an entire surface of the metal layer directly contacting another entire surface of the transistor layer; and
a programmable interconnect layer patterned within at least one of the metal layer and the semiconductor substrate to determine power allocation in a voltage region of the transistor layer, the programmable interconnect layer having a carbon nanotube structure such that a current applied thereto enables formation of a route in the metal layer, and the carbon nanotube structure having a switch functionality associated therewith based on the current applied thereto.

7. The integrated circuit of claim 6, wherein the programmable interconnect layer includes a trench of electrodes, the carbon nanotube structure being sputtered across the trench, and a planar via coupled to a communication line associated with the carbon nanotube structure.

8. The integrated circuit of claim 6, wherein the programmable interconnect layer is configured to function as a pass gate and a memory element in the metal layer.

9. The integrated circuit of claim 8, wherein the plurality of the programmable interconnect layers further comprises:
an upper interconnect layer having a plurality of upper nanotube switches oriented in a horizontal communication line; and
a lower interconnect layer having a plurality of lower nanotube switches oriented in a vertical communication line.

10. The integrated circuit of claim 9, further comprising a plurality of vias to communicatively couple to the horizontal communication line and the vertical communication line and to provide a buffer space between the upper interconnect layer and the lower interconnect layer.

11. The integrated circuit of claim 9, wherein a vertical via is configured to couple at least two of the programmable interconnect layers.

12. The integrated circuit of claim 9, wherein the upper nanotube switches and the lower nanotube switches are programmable based on an algorithm applied by a data processing system associated with the integrated circuit incorporating the upper interconnect layer and the lower interconnect layer.

13. The integrated circuit of claim 9, wherein the plurality of upper nanotube switches and the plurality of lower nanotube switches are associated with the voltage region in the transistor layer of the integrated circuit.

14. The integrated circuit of claim 13, wherein a utilization rate of the voltage region is monitored on a periodic interval by the integrated circuit, such that the algorithm is processed when the utilization rate drops below a minimum threshold.

15. A microelectronic structure comprising:

a transistor layer formed directly above a semiconductor substrate, with an entire surface of the transistor layer directly contacting an entire surface of the semiconductor substrate;

a metal layer formed above the semiconductor substrate and directly above the transistor layer, with an entire surface of the metal layer directly contacting another entire surface of the transistor layer; and a programmable interconnect layer patterned within at least one of the metal layer and the semiconductor substrate to determine power allocation in a voltage region of the transistor layer, the programmable interconnect layer having a carbon nanotube structure such that a current applied thereto enables formation of a route in the metal layer, and the carbon nanotube structure having a switch functionality associated therewith based on the current applied thereto.

16. The structure of claim 15, wherein the programmable interconnect layer includes a trench of electrodes, the carbon nanotube structure being sputtered across the trench, and a planar via coupled to a communication line associated with the carbon nanotube structure.

17. The structure of claim 15, wherein at least two of the programmable interconnect layers are stacked adjacent to each other.

18. The structure of claim 17, wherein a vertical via is configured to couple at least two of the programmable interconnect layers.

19. The structure of claim 15, wherein the programmable interconnect layer is configured to function as a pass gate and a memory element in the metal layer.

20. The structure of claim 15, wherein a configuration of the route is performed based on an algorithm that considers activity in the voltage region and other voltage regions of an integrated circuit including the microelectronic structure.

* * * * *